US006207353B1

(12) United States Patent
Armacost et al.

(10) Patent No.: US 6,207,353 B1
(45) Date of Patent: Mar. 27, 2001

(54) RESIST FORMULATION WHICH MINIMIZES BLISTERING DURING ETCHING

(75) Inventors: Michael D. Armacost, Wallkill; Willard E. Conley, Cornwall; Tina J. Cotler-Wagner, Newburgh; Ronald A. DellaGuardia, Poughkeepsie; David M. Dobuzinsky, Hopewell Junction; Michael L. Passow, Pleasant Valley; William C. Wille, Red Hook, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/987,808

(22) Filed: Dec. 10, 1997

(51) Int. Cl.[7] ...................................................... G03F 7/00
(52) U.S. Cl. ...................... 430/313; 430/270.1; 216/63; 438/723
(58) Field of Search ................................ 430/270.1, 311, 430/313, 314, 317; 216/63, 67; 438/710, 712, 723

(56) References Cited

U.S. PATENT DOCUMENTS

| | | | |
|---|---|---|---|
| 5,176,790 | 1/1993 | Arleo et al. | 156/643 |
| 5,286,344 | 2/1994 | Blalock et al. | 156/657 |
| 5,296,095 | 3/1994 | Nabeshima et al. | 156/662 |
| 5,324,804 | 6/1994 | Steinmann | 526/313 |
| 5,338,399 | 8/1994 | Yanagida | 156/662 |
| 5,369,061 | 11/1994 | Nagayama | 437/228 |
| 5,429,710 | 7/1995 | Akiba et al. | 216/17 |
| 5,443,690 | * 8/1995 | Takechi et al. | 430/286 |
| 5,468,589 | 11/1995 | Urano et al. | 430/170 |
| 5,550,004 | 8/1996 | Honda | 430/270.1 |
| 5,562,801 | 10/1996 | Nulty | 156/643.1 |
| 5,565,304 | 10/1996 | Honda | 430/311 |
| 5,759,739 | * 6/1998 | Takemura et al. | 430/270.1 |
| 5,786,131 | * 7/1998 | Allen et al. | 430/325 |
| 5,827,634 | * 10/1998 | Thackeray et al. | 430/270.1 |
| 5,861,231 | 1/1999 | Barclay et al. | 430/270.1 |

FOREIGN PATENT DOCUMENTS

| | | |
|---|---|---|
| 0 440 374 A2 | 8/1991 | (EP) . |
| 0 607 899 | 7/1994 | (EP) . |
| 0 651 434 A2 | 5/1995 | (EP) . |
| 0 701 171 A1 | 3/1996 | (EP) . |
| 0 731 501 A1 | 9/1996 | (EP) . |
| 0 768 701 A1 | 4/1997 | (EP) . |
| 0 813 113 A1 | 12/1997 | (EP) . |
| 0 829 766 A2 | 3/1998 | (EP) . |
| 6-214395 | 8/1994 | (JP) . |
| 8-55835 | 2/1996 | (JP) . |
| 9-27483 | 1/1997 | (JP) . |
| 10-186665 | 7/1998 | (JP) . |

OTHER PUBLICATIONS

European Search Report dated Apr. 1, 1999.

Horiike et al., "High rate and highly selective SiO2 etching employing inductively coupled plasma and discussion on reaction kinetics," *Journal of Vacuum Science Technology*, May/Jun. 1995, pp. 801–809.

* cited by examiner

*Primary Examiner*—Kathleen Duda
(74) *Attorney, Agent, or Firm*—Ratner & Prestia; Steven Capella, Esq.

(57) ABSTRACT

A resist formulation minimizes blistering during reactive ion etching processes resulting in an increased amount of polymer by-product deposition. Such processes involve exciting a gaseous fluorocarbon etchant with sufficient energy to form a high-density plasma, and the use of an etchant having a carbon-to-fluorine ratio of at least 0.33. In addition to a conventional photoactive component, resists which minimize blistering under these conditions include a resin binder which is a terpolymer having: (a) units that contain acid-labile groups; (b) units that are free of reactive groups and hydroxyl groups; and (c) units that contribute to aqueous developability of the photoresist. After the photoresist is patterned on the silicon oxide layer and the high-density plasma is formed, the high-density plasma is introduced to the silicon oxide layer to etch at least one opening in the silicon oxide layer. Preferably, the terpolymer is made up of about 70% 4-hydroxystyrene, about 20% styrene, and about 10% t-butylacrylate.

20 Claims, 1 Drawing Sheet

RESIST FORMULATION WHICH MINIMIZES BLISTERING DURING ETCHING

FIELD OF THE INVENTION

The present invention relates in general to manufacturing semiconductor devices and resist formulations used during such manufacture. In particular, the present invention relates to resist formulations designed to minimize blistering during reactive ion etching processes which result in a significant amount of polymer by-product deposition.

BACKGROUND OF THE INVENTION

In the fabrication of semiconductor devices, numerous conductive regions are formed in a semiconductor substrate, and various conductive layers are formed on a semiconductor substrate. The conductive regions and layers are isolated from one another by a dielectric, for example, a silicon oxide layer (preferably silicon dioxide). The silicon oxide may be grown or deposited by physical deposition or by a variety of chemical deposition methods. Additionally, the silicon oxide may be undoped or doped, for example, with phosphorous to form phosphosilicate glass (PSG). The method of forming the silicon oxide layer and the doping of the silicon oxide layer will depend on various device and processing considerations.

During the manufacture of semiconductor devices, photoresists, which are photosensitive films used for the transfer of images to a multilayer structure, are formed on the multilayer structure, such as a silicon oxide layer of a multilayer structure. The photoresist layer is then exposed through a photomask to a source of activating radiation. The photomask has areas which are opaque to activating radiation and other areas which are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image which permits selective processing of the underlying structure.

At several stages during fabrication, it is necessary to make openings in the dielectric to allow for contact to underlying regions or layers. Generally, an opening through a dielectric layer exposing a diffusion region of the substrate or an opening through a dielectric layer between polysilicon and the first conductive layer (i.e., the conductive layer closest to the substrate) is called a "contact opening." An opening in a silicon oxide layer formed elsewhere is generally referred to as a "via." As used herein, an "opening" will be understood to refer to any type of opening through any type of silicon oxide layer, regardless of the stage of processing, the layer exposed, or the function of the opening.

To form openings, a patterning layer of photoresist, which has openings corresponding to the regions of the silicon oxide layer openings to be formed, is formed over the silicon oxide layer. In most modern processes, a dry etch is performed wherein the wafer is exposed to a plasma, which is formed in a flow of one or more gasses called the etchant gas. One or more compounds are used as the etchant gas. For example, $CF_4$, $CHF_3$, $SF_6$, and other gases may be used as, or as part of, the etchant gas. In addition, gases such as $O_2$, Ar, $N_2$, and others may be added. The particular gas mixture used will depend on the characteristics of the silicon oxide being etched and the desired etch characteristics such as etch rate, wall slope, and anisotropy.

In addition to the composition of the etchant gas, other factors influence the etch characteristics. These other factors include temperature, pressure, and gas flow rate, among others. These factors, as well as the composition of the etchant gas, may be varied to achieve the desired etch characteristics. There are invariably trade-offs between the various characteristics and the quality of the resulting etched structure. For instance, it is sometimes desirable to etch a multilayer structure with a high selectivity to silicon oxide as opposed to silicon nitride. Also, it may be desirable to etch a relatively thick layer of silicon oxide (especially doped silicon oxide). The process conditions that are designed to perform these two functions usually employ an etchant with a high carbon-to-fluorine ratio in a high-density plasma. More specifically, an etchant having a high carbon-to-fluorine ratio selectively etches silicon oxide over nitrogen-containing layers. Also, such an etchant, together with high-density plasma conditions, results in an aggressive etch rate capable of etching a relatively thick layer of silicon oxide.

One of the trade-offs mentioned above results from the fact that conditions selective to etching silicon oxide create an increased amount of polymer by-product deposition on the surface of the photoresist. The deposited polymer by-product is beneficial because it minimizes etching of the photoresist itself (which is undesirable). On the other hand, the presence of the by-product deposited on the photoresist contributes to the formation of detrimental "blisters" that occur on the surface of the photoresist. Blistering occurs when volatile constituents evolve from layers below the polymer by-product at a rate faster than the volatile constituents can diffuse through the polymer by-product.

The use of high-density plasma conditions accelerates etch rate and increases wafer temperature. These conditions can accelerate, in turn, the evolution of volatile constituents both from the photoresist and from the underlying layers (e.g., the silicon oxide layer itself). The combination of by-product deposition and the increased-rate volatilization combine to create kinetic problems; in particular, the rate of volatile evolution within the resist and the underlying layers is greater than the rate that the volatiles can diffuse through the deposited by-product layer out to the plasma atmosphere. In addition, relatively wide areas of unopened or unpatterned photoresist between the openings in the resist also contribute to blistering because the gas escape route to the side walls is longer in this event (i.e., a higher percentage of volatiles would not reach the side walls). The result is blistering or lift off of the deposited polymer layer, or both. Such blistering interferes with the ability of the etch process to generate the desired structure through the silicon oxide layer and with the ability to further process the etched wafer to generate a reliable product.

Accordingly, there remains a need for etching processes which avoid the problems associated with volatiles evolving during etching, particularly during etching conditions which result in the formation of increased polymer by-product. Such etching conditions typically include high-density plasma etching and the use of an etchant gas having a high carbon-to-fluorine ratio.

SUMMARY OF THE INVENTION

To meet this and other needs, and in view of its purposes, the present invention provides a method for etching a silicon oxide layer of a multilayer structure. The method involves first forming a pattern in a photoresist disposed over the silicon oxide layer. The photoresist comprises a photoactive component and a resin binder which is a terpolymer having: (a) units that contain acid-labile groups; (b) units that are free of reactive groups and hydroxyl groups; and (c) units that contribute to the aqueous developability of the photoresist containing the terpolymer as a resin binder. A gaseous fluorocarbon etchant with a carbon-to-fluorine atomic ratio of at least 0.33 is excited with sufficient energy to form a high-density plasma (i.e., having a density of at least $10^{11}$ ions/cm$^3$). After its formation, the high-density plasma is introduced to the silicon oxide layer to etch an opening in the silicon oxide layer.

In a preferred embodiment of the present invention, the photoresist is deposited over a silicon oxide layer which itself is formed over a nitrogen-containing etch stop layer, and a high-density plasma etch of the silicon oxide layer is performed with high selectivity to the silicon oxide deposited over the nitrogen-containing etch stop layer. In another embodiment of the present invention, the photoresist is deposited over a silicon oxide layer with a thickness of at least 0.5 $\mu$m. The silicon oxide layer is then etched with a high-density plasma to form at least one opening with the underlying layer or substrate.

Preferably, the terpolymer used in the resist of the present invention comprises about 70% 4-hydroxystyrene, about 20% styrene, and about 10% t-butylacrylate. It has been found that use of these terpolymers in the photoresist eliminates the blistering effect that is caused by aggressive high-density plasma etches with an etchant gas having a carbon-to-fluorine ratio of at least 0.33, preferably 0.50. These blistering effects are also eliminated during high-density plasma etches of thick silicon oxide layers, such as phosphosilicate glass.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
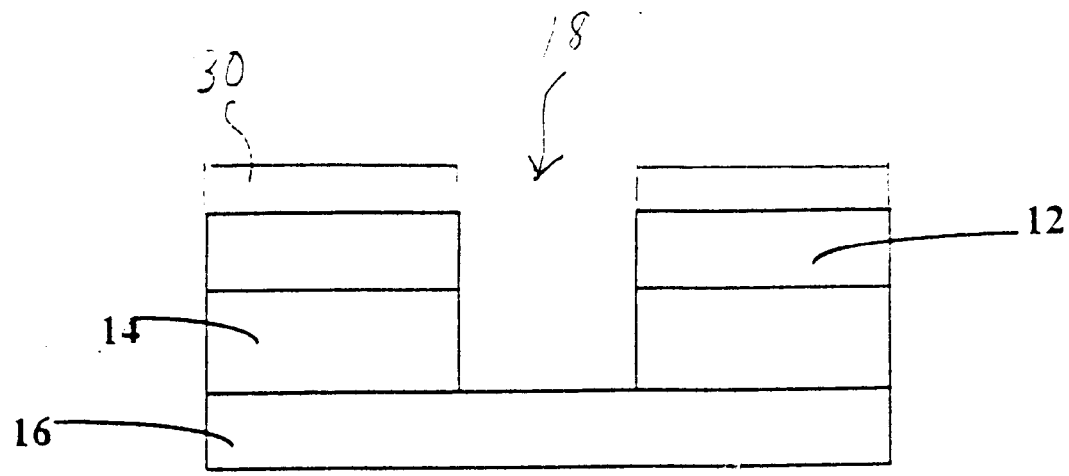
FIG. 1 illustrates a cross-sectional view of a structure after a high-density plasma etch of a silicon oxide layer has been performed according to the present invention.

The present invention is directed to an improved high-density plasma etching method for etching an opening in a silicon oxide layer of a multilayer structure, such as a semiconductor device. The method of the present invention is particularly well suited to reactive ion etching processes which result in an increased amount of polymer by-product deposition. Although there are many parameters which influence whether a particular reactive ion etching process results in an increased amount of polymer by-product deposition, these processes can be generally characterized by etch chemistries which have a relatively high carbon-to-fluorine atomic ratio and utilize high-density plasmas (i.e., plasmas having an ion density of above $10^{11}$ ions/cm$^3$).

Even more specifically, the present invention is directed to utilizing a particular resist formulation which does not result in the evolution of a high quantity of volatile constituents, under given process conditions (i.e., high-density plasma etching using an etching gas having a high carbon-to-fluorine ratio), whereas, under those same process conditions, a conventional resist formulation would result in the evolution of a sufficient amount of volatile constituents to create blistering. Such blistering can lead to tool contamination and contact opens, which have a detrimental impact on the quality of the etched product.

The method of the present invention serves to etch a silicon oxide layer of a multilayer structure. The multilayer structure refers to a semiconductor device having a substrate with conductive and non-conductive regions and various layers formed over the substrate. The layers can include a dielectric (such as a silicon oxide layer), conductive layers, as well as etch-stop layers (such as silicon nitride). The method results in the etching of at least one opening in a silicon oxide layer of the multilayer structure.

The method of the present invention is carried out in general by three steps: (1) depositing and subsequently patterning and processing a photoresist over the silicon oxide layer; (2) exciting a gaseous fluorocarbon etchant, having a carbon-to-fluorine ratio of at least 0.33, with sufficient energy to form a high-density plasma; and (3) introducing the high-density plasma to the silicon oxide layer to etch the layer (i.e., form an opening in the layer).

In general, the first step is carried out in a manner consistent with U.S. Pat. No. 5,861,231, issued on Jan. 19, 1999, and titled "Novel Copolymers and Photoresist Compositions Comprising Copolymer Resin Binder," which is incorporated herein by reference. More specifically, the photoresist is coated onto a surface, dried, then imaged through a mask in a conventional manner. Following exposure which activates the photoactive component of the resist, the photoresist is baked then developed by known developers, such as an inorganic alkali. The components which form the photoresist are discussed in more detail below.

The second step, namely exciting a gaseous fluorocarbon etchant, having a carbon-to-fluorine ratio of at least 0.33, with sufficient energy to form a high-density plasma, can be carried out by any known procedure. The parameters which influence the plasma include the particular reactive ion etching apparatus used, the power applied (both source power and bias power), the temperature of the apparatus, the pressure of the apparatus, the composition of the etchant gas, and the flow rate of the etchant gas. One skilled in the art could easily select these parameters to excite the etchant gas to achieve a high-density plasma, which is a plasma having a density of at least $10^{11}$ ions/cm$^3$. For example, a high-density plasma can be achieved by using an Applied Materials, Inc. AME 5300 HDP reactive ion etching apparatus with a roof temperature of 210° C., a wall temperature of 215° C., a source power and bias power of 1200 watts each, and utilizing various etchant gases at open throttle resulting in an effective pressure of about 3 to 6 millitorr.

As mentioned above, the present invention is particularly well suited to etching environments in which a polymer by-product layer is readily formed. Such environments can be characterized by an etchant gas having a high carbon-to-fluorine ratio. As used herein, a high carbon-to-fluorine ratio is at least 0.33, and preferably 0.50. Fluorocarbon gases suitable as additives in the present invention include $C_2F_6$, $C_4F_8$, $C_5F_{10}$, and higher C:F ratio fluorocarbons. References herein to the etchant gas are to the feed gas, prior to any reaction of the feed gas caused by exposure to the energy forming the plasma. The invention is particularly well suited to use with a fluorocarbon having a carbon-to-fluorine ratio of at least 0.5, such as $C_4F8$. Other gases may be added to the etchant gas, such as Ar or $N_2$. The relative concentrations of the various gases which comprise the etchant gas may vary within known ranges. As shown in the example, the ratio of the fluorocarbon gas to argon may vary from 1:30 to 1:15, although the ratio may easily be as high as 1:10 (and still higher).

The third step mentioned above, namely introducing the high-density plasma to the silicon oxide layer to etch an opening in the oxide layer, also is carried out by well-known procedures. Typically, the multilayer structure is placed within the closed area defined by the etching apparatus. Upon contact with the multilayer structure, the high-density plasma begins to etch those areas of the silicon oxide layer which are not protected by a resist layer. In this way, openings are formed in the silicon oxide layer. After a period of time, the flow of etchant gas to the etching apparatus is stopped.

As mentioned above, the first step of the method of the present invention, namely forming a pattern in a photoresist disposed over a silicon oxide layer, is carried out in a manner consistent with U.S. Pat. No. 5,861,231 incorporated herein by reference.

Photoresists of the invention include a photoactive component and a terpolymer used as a resin binder component. Any known photoactive component may be used in connection with the present invention. A photoactive component is a component which reacts with activating radiation to those areas exposed to activating radiation either less soluble (for a negative-acting resist) or more soluble (for a positive-acting resist) than unexposed portions. For example, sulfonate compounds are preferred photoactive components. Such compounds include sulfonate salts, sulfonate esters, and sulfonyloxy ketones. Preferred photoactive components include onium salts, such as di-t-butylphenyliodonium camphor sulfonate. Other components suitable for use as photoactive components are disclosed in U.S. Pat. No. 5,861,231.

Preferred polymers of the invention include at least three, distinct, repeating units of (1) units that contain acid-labile groups; (2) units that are free of reactive groups as well as hydroxyl groups; and (3) aromatic or other units that contribute to the aqueous developability of a photoresist containing the terpolymer as a resin binder. The polymers also may include other groups if desired. References herein to polymer units (2) that do not contain "reactive groups" mean units that will not react with acid or thermally (generally less than about 170° C.) under typical lithographic processing (pre-exposure, exposure, post-exposure bake and development steps) of a photoresist containing the terpolymer. Thus, units (2) could be a phenyl group with one or more non-volatile ring substituents such as a halogen or an alkoxy.

Terpolymer units (1) include acid labile groups that will undergo photoacid-induced cleavage upon exposure of a coating layer of a photoresist containing the polymer to provide solubility differentials between exposed and unexposed coating layer regions. The acid labile groups are preferably pendant to the polymer backbone. Acrylate groups are generally preferred and can be formed by free radical or other condensation of monomers of one or more substituted or unsubstituted alkyl acrylates such as t-butylacrylate. The pendant substituted ester moiety of the condensed acrylate unit, i.e. R—O—C(=O)—, serves as the pendant acid labile groups.

A wide variety of acrylate units may be employed including those having an ester group (group R above) that is a non-cyclic or cyclic alkyl having 1 to about 14 carbon atoms, more typically 1 to about 8 carbon atoms. Also suitable will be such alkyl ester groups that have one or more substituents such as halogen, particularly F, Cl, or Br; $C_{1-6}$ alkoxy; aryl such as phenyl; and the like. Exemplary compounds that may be condensed to provide the acrylate units of the polymers of the invention include methylacrylate, ethylacrylate, methylmethacrylate, ethylmethacrylate, butylacrylate including t-butylacrylate, butylmethacrylate including t-butylmethacrylate, etc. Such monomers are commercially available or can be readily prepared by known procedures.

A variety of other groups also will be suitable acid labile moieties of units (1). In particular, acetate groups will be suitable, including groups pendant to the polymer backbone of the formula $R^3O$ (C=O)$R^2R^1C$— where $R^1$ and $R^2$ are each independently selected from the group of hydrogen, substituted or unsubstituted $C_{1-10}$ alkyl, or an electron-withdrawing group such as a halogen; and $R^3$ substituted or unsubstituted $C_{1-14}$ alkyl, substituted or unsubstituted aryl such as phenyl, or substituted or unsubstituted aralkyl such as benzyl. The substituents of substituted groups can be, e.g., a halogen, $C_{1-6}$ alkyl, $C_{1-6}$ alkoxy, phenyl or other aryl, etc. Such acetate groups may be provided as described above for acrylate groups, i.e., by free radical or other condensation of monomers of one or more substituted or unsubstituted vinyl acetates such as allyl acetate and the like.

Terpolymers of the invention also include units (2) that are free of reactive and hydroxyl groups. Preferred units (2) also have a high carbon content, and preferably at least about 75 percent of the unit's total mass is carbon, more preferably at least about 80 or even at least 90 percent of the unit's total mass is carbon. Specifically preferred groups include substituted and unsubstituted aryl groups, e.g., groups having about 6 to 18 aromatic carbons such as groups provided by condensation of substituted or unsubstituted styrene, naphthylene, acenaphthylene, etc. as well as substituted and unsubstituted vinyl alicyclic groups including those having 5 to about 12 carbon atoms such as substituted or unsubstituted vinyl norbornyl, vinyl adamantyl, or vinyl cyclohexane. Non-cyclic substituted and unsubstituted alkyl groups also may be employed, e.g., having 1 to about 12 carbon atoms, but are generally less preferred than aryl or alicyclic groups. Suitable substituents of substituted or unsubstituted groups include $C_{1-8}$ alkoxy, particularly methoxy, ethoxy, and propoxy; cyano; halogen (F, Cl, Br, or I); alkynyl having 2 to about 10 carbon atoms; alkythio having 1 to about 10 carbon atoms; and the like.

Terpolymers of the invention also contain units (3) that contribute to aqueous developability of a photoresist containing the polymer as a resin binder. Aromatic groups such as substituted and unsubstituted phenyl and the like are generally preferred. For example, preferred groups contain hydroxyl or carboxyl groups. Vinyl aromatic monomers substituted with such groups are generally preferred, e.g., a substituted or unsubstituted hydroxystyrene. Non-aromatic monomers also may be employed, e.g., vinyl cyclohexanol. Also, to facilitate polymer synthesis, a monomer may be reacted with a hydroxyl group or other aqueous-solubilizing group in "masked" form. For example, vinylphenylacetate may be employed as a "masked" form of hydroxystyrene. Other hydroxy masking or protecting groups also will be suitable such as alkylsilyl groups (to form silylethers with the hydroxy moiety), e.g., $(CH_3)_3Si$—, $(CH_3)_2$ (butyl)Si—, $(CH_3)_3C)_3Si$—, etc.; other alkyl esters, e.g., $CH_3CH_2C(=O)$— and the like. After reaction completion, the masking groups may be removed under basic conditions. For example, the formed polymer may be heated in the presence of a base such as $NH_4OH$ or $NH_4OAc$. See the examples which follow for exemplary conditions.

According to the present invention, a preferred terpolymer of the photoresist employed in the high-density plasma etch of the silicon oxide layer is of the following Formula 1:

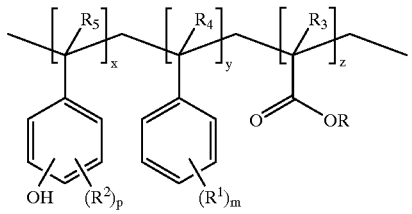

wherein R is substituted or unsubstituted alkyl;

each $R^1$ is independently a halogen, substituted or unsubstituted alkyl, substituted or unsubstituted alkoxy, substituted or unsubstituted alkenyl, substituted or unsubstituted alkynyl, substituted or unsubstituted alkylthio, cyano, or nitro, or two adjacent $R^1$ groups may be taken together to form one or more fused aromatic or alicyclic rings;

m is an integer from 0 to 5;

each $R^2$ is independently a halogen, substituted or unsubstituted alkyl having 1 to about 8 carbons, substituted or unsubstituted alkoxy, substituted or unsubstituted alkenyl, substituted or unsubstituted sulfonyl, substituted or unsubstituted alkyl ester, substituted or unsubstituted alkynyl, substituted or unsubstituted alkylthio, cyano, or nitro, or two adjacent $R^2$ groups may be taken together to form one or more fused aromatic or alicyclic rings;

p is an integer from 0 to 4;

each $R^3$, $R^4$, and $R^5$ is independently hydrogen or substituted or unsubstituted alkyl; and x, y, and z are mole fractions or percents of the units (3), (2), and (1), respectively.

According to one embodiment of the present invention, in the photoresist of Formula 1, R is alkyl having 1 to about 5 carbon atoms, m is 0, 1, or 2, and the hydroxyl group is meta or para substituted. In addition, the sum of x, y, and z is at least 50% and, more preferably, the sum of x, y, and z is at least 90%, where percentages are expressed as mole percentages.

According to a preferred embodiment of the present invention, in the photoresist of Formula 1, x is from about 50% to about 90%, most preferably about 70%, y is from about 5% to about 40%, most preferably about 20%, and z is from about 5% to about 40%, most preferably about 10%.

As mentioned above, it is desired that the resist include a resin binder terpolymer which minimizes the generation of volatile constituents during high-density plasma etching in order to minimizing blistering. It has been found that the photoresists of U.S. Pat. No. 5,861,231 which contain less acid-labile group monomers are preferred. Even more preferable are photoresists containing less hydroxystyrene monomer relative to the amount of hydroxyl-free styrene monomer and most preferably photoresists containing a styrene-hydroxystyrene-acrylate terpolymer. Most preferably is a terpolymer comprising about 70% 4-hydroxystyrene, about 20% styrene, and about 10% t-butylacrylate. As shown from the examples below, this particular resist minimizes blistering in high-density plasma etching with an etchant gas of $C_4F_8$ and argon.

According to another embodiment of the present invention, the silicon oxide layer to be etched has a thickness of at least 0.5 $\mu$m. Such a thickness may exist when the silicon oxide layer is etched to form at least one contact with an underlying substrate, or when a doped silicon oxide layer, such as phosphosilicate glass, is etched.

Referring to FIG. 1, in one embodiment of the present invention, the method comprises forming a pattern in a photoresist 12 disposed over a silicon oxide layer 14 wherein the photoresist comprises a photoactive component and a resin binder comprising a terpolymer having (a) units that contain acid-labile groups; (b) units that are free of reactive groups and hydroxyl groups; and (c) units that contribute to the aqueous developability of the photoresist. Next, a gaseous fluorocarbon etchant with a high carbon-to-fluorine ratio of at least 0.33, more preferably of at least 0.5, is excited with sufficient energy to form a high-density plasma. High-density plasma refers to the charged particle density in the plasma. In a conventional or typical density plasma, the ion density is typically less than about $10^{11}$ $cm^{-3}$, whereas in a high-density plasma the fractional ionization is above $10^{11}$ $ions/cm^3$. The high-density plasma is then introduced to the silicon oxide layer 14 to etch an opening 18 in silicon oxide layer 14 through to the silicon substrate 16.

Figure 2:
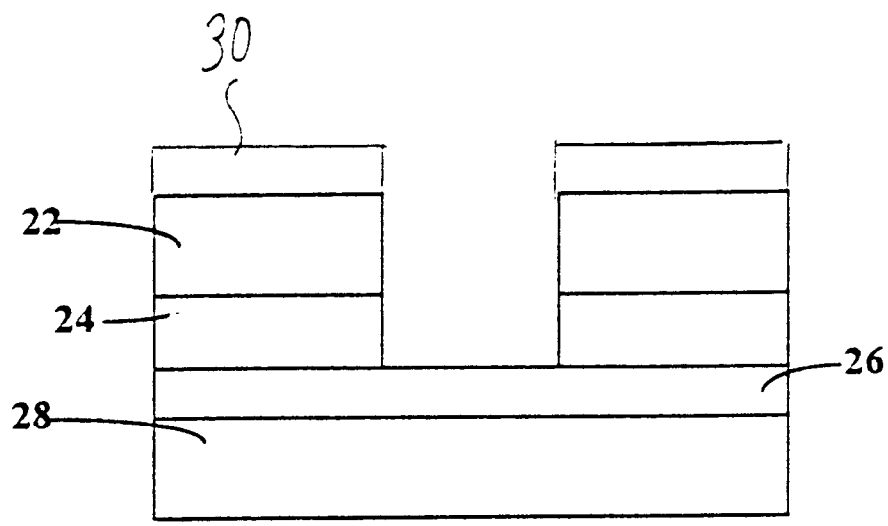
FIG. 2 illustrates a cross-sectional view of a structure after a high-density plasma etch with selectivity to silicon oxide deposited over a silicon nitride layer has been performed according to the present invention.

Referring to FIG. 2, in another embodiment of the present invention, the multilayer structure to be etched by the high-density plasma includes a patterned photoresist 22 disposed over a silicon oxide layer 24 which is deposited over a nitrogen-containing etch stop layer 26, and the step of introducing the high-density plasma to the silicon oxide layer 24 to etch the silicon oxide layer 24 includes etching the silicon oxide layer 24 over the nitrogen-containing etch stop layer 26, which may be deposited over a silicon substrate 28.

Also shown in FIGS. 1 and 2 is a polymer by-product layer 30. Polymer by-product layer 30 is formed during the etching process from the polymerization of fluorocarbons (or other etchant gas constituents) and the deposition of such polymerized layers onto the resist. As shown in FIGS. 1 and 2, polymer by-product layer 30 is primarily only found on the resist layer (shown as photoresist 12 in FIG. 1 and photoresist 22 in FIG. 2). In some etching processes, a polymer by-product layer may also be formed on the side walls of some of the other layers. The formation of a polymer by-product layer on the resist layer helps the resist layer to avoid being etched itself. For this reason, the presence of the polymer by-product layer 30 over the resist layer is an advantage, although blistering and subsequent delamination of a polymer by-product layer can be detrimental to the process.

EXAMPLES

In order to show the efficacy of the present invention, a photoresist according to the present invention was used in two methods for etching a silicon oxide layer under the same conditions as two known photoresists. In particular, the starting substrates to be etched were prepared by coating a silicon wafer with the following layers in order of proximity to the wafer surface: 500 Å silicon nitride; 6,500 Å phosphosilicate glass (6 weight percent $P_2O_5$) (i.e., a silicon oxide layer); 900 Å antireflective coating; and 0.7 micrometers of a specified photoresist as indicated in Table 1.

TABLE 1

| Example | Photoresist | Gas Composition (sccm) | Appearance |
|---|---|---|---|
| 1 | Invention | 5 C$_4$F$_8$/150 Ar | No Blistering |
| 2 | Invention | 10 C$_4$F$_8$/150 Ar | No Blistering |
| 3 | Apex E | 5 C$_4$F$_8$/150 Ar | Blistering |
| 4 | Apex E | 10 C$_4$F$_8$/150 Ar | Blistering |
| 5 | UV2HS | 5 C$_4$F$_8$/150 Ar | Blistering |
| 6 | UV2HS | 10 C$_4$F$_8$/150 Ar | Blistering |

The photoresist of Examples 1 and 2, labeled "invention," included a photoresist comprising a photoactive component and a terpolymer of polyhydroxystyrene/styrene/tert-butylacryate in a 70/20/10 molar ratio. The resists labeled Apex E and UV2HS are commercially available DUV photoresists available from the Shipley Company, LLC, Marlboro, Mass.

The substrates were then patterned using the appropriate ultraviolet radiation and a pattern was developed. The resulting substrates were then treated in an Applied Materials, Inc. AME 5300 HDP reactive ion etching apparatus. With the gas compositions indicated in Table 1, the etching unit was operated at open throttle resulting in an effective pressure of about 3–6 millitorr. Other operating conditions were: roof temperature=210° C., wall temperature=215° C., source power=1200 watts, and bias power=1200 watts. The process was conducted until an optically determined end point corresponding to exposure of the silicon nitride layer was reached (i.e., about 70 to 80 seconds for all examples).

The examples clearly show that, under the same process conditions (high-density plasma etching with an etchant gas including C$_4$F$_8$), the method using a photoresist of the present invention does not result in blistering of the polymer by-product, while the polymer by-product layers formed over two conventional resists blistered. In addition to the above examples, other experiments were performed in an effort to avoid the occurrence of blistering for the Apex E and UV2HS resists. These experiments included varying the argon flow to 100 cm$^3$ per minute, UV hardening of the resist prior to etching, and outgassing of the PSG layer. None of these variations alleviated the blistering problem.

Although the present invention has been described with reference to specific embodiments, it is not necessarily limited to those embodiments. Accordingly, the appended claims should be construed to encompass not only those forms and embodiments of the invention specifically described above, but such other forms and embodiments as may be devised by those skilled in the art without departing from the true spirit and scope of the claimed invention.

What is claimed:

1. A method for minimizing blistering while etching a silicon oxide layer of a multilayer structure, said method comprising the steps of:
    selecting a photoresist comprising:
      (a) a photoactive component; and
      (b) a resin binder comprising a terpolymer having:
        i) units that contain acid-labile groups;
        ii) units that are free of reactive groups and hydroxyl groups;
        iii) units that contribute to aqueous developability of said photoresist;
        wherein the units that contain acid-labile groups comprise between 5 mole percent and 40 mole percent of all of the units of said terpolymer;
        wherein said resin binder minimizes blistering;
    forming a pattern in said photoresist disposed over a silicon oxide layer;
    exciting a gaseous fluorocarbon etchant, having a carbon-to-fluorine atomic ratio of at least 0.33, with sufficient energy to form a high-density plasma; and
    introducing said high-density plasma to said silicon oxide layer to etch said silicon oxide layer.

2. The method of claim 1, wherein said high-density plasma has a density of at least $10^{11}$ ions/cm$^3$.

3. The method of claim 1, wherein said carbon-to-fluorine ratio is at least 0.5.

4. The method of claim 1, wherein:
    said multilayer structure includes a nitrogen-containing etch stop layer; and
    said silicon oxide layer is formed over said etch stop layer.

5. The method of claim 1, wherein said silicon oxide layer has a thickness of between 0.5 μm to 0.65 μm.

6. The method of claim 1, wherein said silicon oxide layer is etched to form at least one opening in said silicon oxide layer to an underlying substrate.

7. The method of claim 1, wherein said units that are free of reactive groups and hydroxyl groups are aromatic units.

8. The method of claim 7, wherein said aromatic units contain 80% (by weight) carbon.

9. The method of claim 1, wherein said acid labile groups comprise pendant acrylate acid labile groups.

10. The method of claim 1, wherein said units that contribute to aqueous developability comprise hydroxyl substituents.

11. The method of claim 1, wherein said terpolymer is of the following formula:

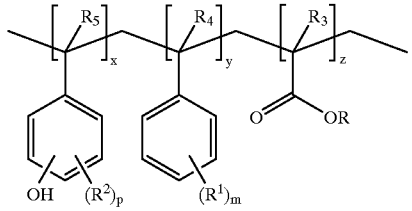

wherein R is substituted or unsubstituted alkyl;
    each R$^1$ is independently a halogen, substituted or unsubstituted alkyl, substituted or unsubstituted alkoxy, substituted or unsubstituted alkenyl, substituted or unsubstituted alkynyl, substituted or unsubstituted alkylthio, cyano, or nitro, or two adjacent R$^1$ groups may be taken together to form one or more fused aromatic or alicyclic rings;
    m is an integer from 0 to 5;
    each R$^2$ is independently a halogen, substituted or unsubstituted alkyl having 1 to about 8 carbons, substituted or unsubstituted alkoxy, substituted or unsubstituted alkenyl, substituted or unsubstituted sulfonyl, substituted or unsubstituted alkyl ester, substituted or unsubstituted alkynyl, substituted or unsubstituted alkylthio, cyano, or nitro, or two adjacent R$^2$ groups may be taken together to form one or more fused aromatic or alicyclic rings;
    p is an integer from 0 to 4;
    each R$^3$, R$^4$, and R$^5$ is independently hydrogen or substituted or unsubstituted alkyl; and
    x, y, and z are mole percents of said units (iii), (ii), and (i), respectively, whereby z is from 5% to 40%.

12. The method of claim 11, wherein R is alkyl having 1 to about 5 carbon atoms; m is 0, 1, or 2; and the hydroxyl group is meta or para substituted.

13. The method of claim 11, wherein x is from 50% to 90%, and y is from 5% to 40%.

14. The method of claim 11, wherein x is 65% to 75%, y is 10% to 20%, and z is 10% to 20%.

15. The method of claim 11, wherein the terpolymer comprises 65% to 75% 4-hydroxystyrene, 10% to 20% styrene, and 10% to 20% t-butylacrylate.

16. The method of claim 11, wherein the terpolymer comprises 70% 4-hydroxystyrene, 20% styrene, and 10% t-butylacrylate.

17. The method of claim 1, wherein said etchant comprises $C_4F_8$.

18. A method for minimizing blistering while etching a silicon oxide layer from a multilayer structure, said method comprising the steps of:
  selecting a photoresist comprising:
    (a) a photoactive component; and
    (b) a resin binder comprising a terpolymer comprising 70% 4-hydroxystyrene, 20% styrene, and 10% t-butylacrylate, wherein said resin binder minimizes blistering;
  forming a pattern in said photoresist disposed over a silicon oxide layer;
  exciting a gaseous fluorocarbon etchant comprising $C_4F_8$ with sufficient energy to form a high-density plasma having a density of at least $10^{11}$ ions/cm$^3$; and
  introducing said high-density plasma to said silicon oxide layer to etch said silicon oxide layer.

19. The method of claim 1 wherein the step of introducing said high-density plasma to said silicon oxide layer further comprises forming a polymer byproduct layer over said photoresist.

20. The method of claim 18 wherein the step of introducing said high-density plasma to said silicon oxide layer further comprises forming a polymer byproduct layer over said photoresist.

* * * * *